US005602860A

United States Patent [19]
Masonson

[11] Patent Number: 5,602,860
[45] Date of Patent: Feb. 11, 1997

[54] LASER THERMAL CONTROL USING THERMOELECTRIC COOLER

[75] Inventor: Raymond H. Masonson, Derwood, Md.

[73] Assignee: Optelecom, Inc., Gaithersburg, Md.

[21] Appl. No.: 424,116

[22] Filed: Apr. 19, 1995

[51] Int. Cl.⁶ .................................................. H01S 3/04
[52] U.S. Cl. .................................. 372/34; 372/25; 372/36
[58] Field of Search .......................... 372/34, 36; 373/25

[56] References Cited

U.S. PATENT DOCUMENTS

| | | |
|---|---|---|
| 4,288,854 | 9/1981 | Burroughs . |
| 4,433,238 | 2/1984 | Adolfsson et al. . |
| 4,583,228 | 4/1986 | Brown et al. . |
| 4,631,728 | 12/1986 | Simons ........................................ 372/34 |
| 4,733,253 | 3/1988 | Daniele . |
| 4,792,957 | 12/1988 | Kollanyi ..................................... 372/34 |
| 5,029,311 | 7/1991 | Brandkamp et al. . |
| 5,043,992 | 8/1991 | Royer et al. . |
| 5,088,098 | 2/1992 | Muller et al. ............................... 372/34 |
| 5,113,404 | 5/1992 | Gaebe ety al. ............................. 372/34 |
| 5,118,964 | 6/1992 | McArdle ..................................... 372/34 |
| 5,140,607 | 8/1992 | Paiva . |
| 5,181,214 | 1/1993 | Berger et al. ............................... 372/34 |
| 5,267,252 | 11/1993 | Amano ....................................... 372/34 |
| 5,399,858 | 3/1995 | Kinoshita ................................... 372/36 |
| 5,446,750 | 8/1995 | Ohtsuka et al. ............................ 372/34 |

*Primary Examiner*—Leon Scott, Jr.
*Attorney, Agent, or Firm*—William L. Feeney; Kerkam, Stowell, Kondracki & Clarke, P.C.

[57] ABSTRACT

A system uses a parallel switch/thermoelectric cooler circuit between a voltage source and a subsystem having a laser diode in thermal contact with the thermoelectric cooler. The switch opens when the temperature is above a switch temperature such that current is supplied to the thermoelectric cooler in order to cool the laser. The thermoelectric cooler uses energy which would otherwise be wasted in a voltage regulator. The subsystem includes an optical transmitter using the laser to send signals. An alternate arrangement uses a pulse width modulator to provide proportional control for more precise regulation of the laser temperature.

20 Claims, 3 Drawing Sheets

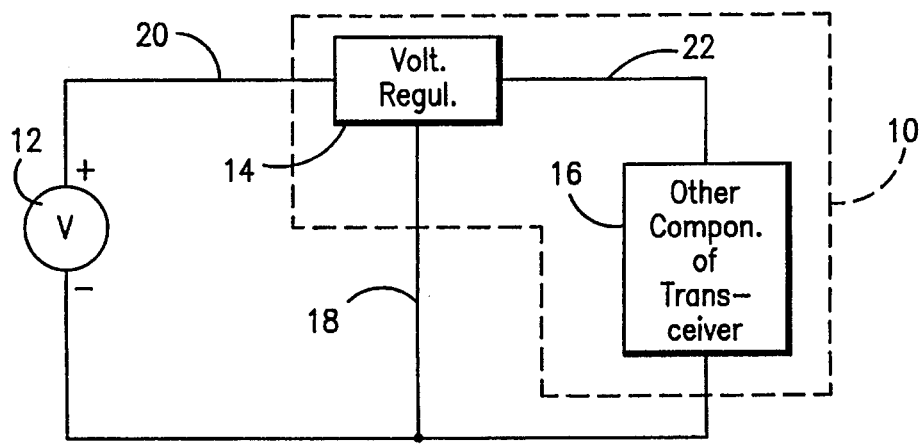
FIG. 1
PRIOR ART
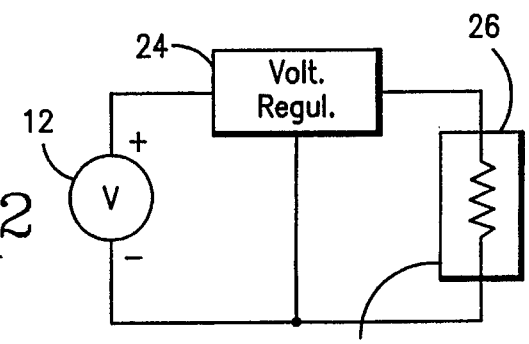
FIG. 2
PRIOR ART
FIG. 4
PRIOR ART
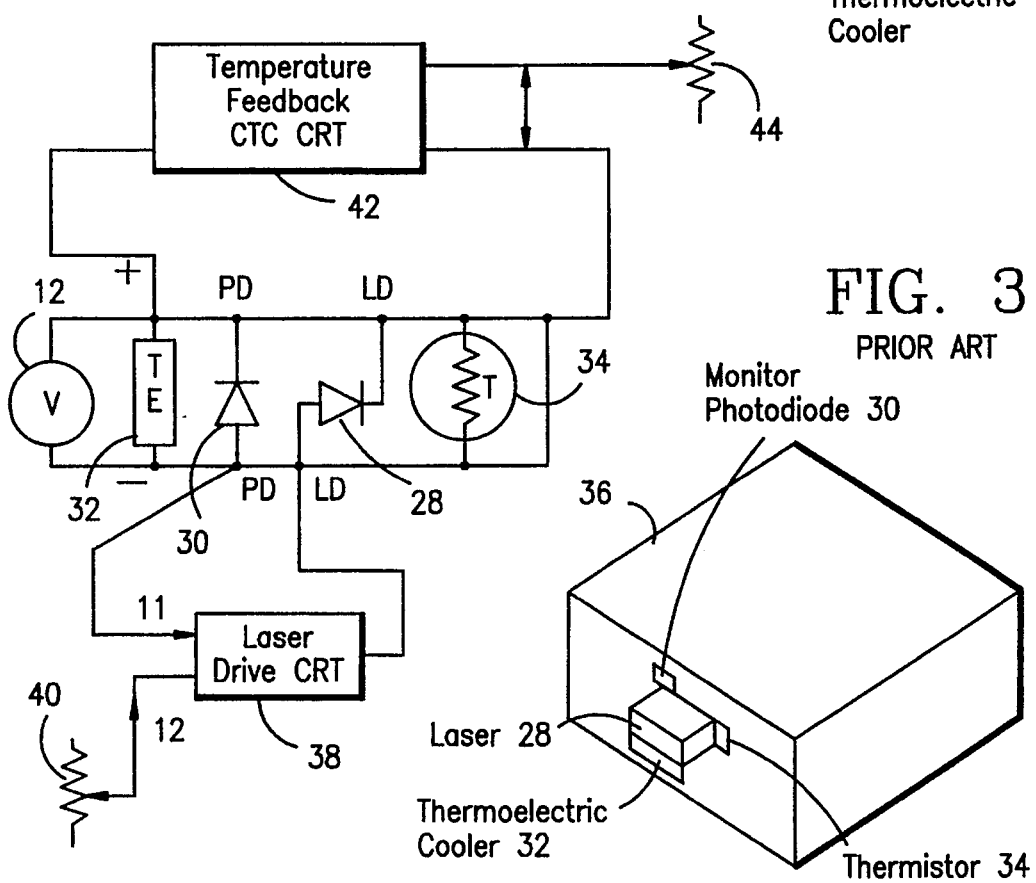
FIG. 3
PRIOR ART

LASER THERMAL CONTROL USING THERMOELECTRIC COOLER

BACKGROUND OF THE INVENTION

The present invention relates to a circuit for maintaining a laser operating relatively efficiently. More specifically, the present invention relates to such a circuit using a thermoelectric cooler.

The amplitude of light out of a laser diode is reduced as the diode heats up. Additionally, some systems have problems if laser diodes change wavelength due to heating. Accordingly, various arrangements including heat sinks and/or cooling fans have been used to prevent such semiconductor lasers from having their light output amplitude overly reduced by heat or having the wavelength of output light changed too much. If a laser diode is used for an optical transmitter, temperature change problems can adversely affect the operation of the transmitter (which may be part of an optical transceiver). The following patents are among various prior designs:

| U.S. Pat. No. | Inventor | Issue Date |
| --- | --- | --- |
| 4,288,854 | Burroughs | September 8, 1981 |
| 4,433,238 | Adolfsson et al | February 21, 1984 |
| 4,583,228 | Brown et al | April 15, 1986 |
| 4,733,253 | Daniele | March 22, 1988 |
| 5,029,311 | Brandkamp et al | July 2, 1991 |
| 5,043,992 | Royer et al | August 27, 1991 |
| 5,140,607 | Paiva | August 18, 1992 |

The Daniele patent discloses feedback control of temperature in a laser diode and the use of a thermoelectric cooler 70 in a feedback arrangement for a diode 15 in FIG. 3.

The Burroughs patent discloses a temperature controller for controlling a body which is disclosed as being an injection laser for use in an optical communication system.

The Adolfsson patent discloses at the top of column 6 that a thermoelectric cooler may be used to maintain a light emitting diode at a constant voltage.

The Brown patent discloses frequency stabilization of lasers using a feedback arrangement.

The Brandkamp patent discloses a fluorescent lamp having a thermoelectric cooler 81 to stabilize temperature. The lamp is used in a document scanning system.

The Royer patent shows a laser driver having temperature compensation.

The Paiva patent discloses a laser device with an arrangement for dissipating and stabilizing heat generated by the laser diode.

Thermoelectric coolers have been used for cooling lasers, but have generally required larger, more expensive power supplies than would otherwise be used and/or such coolers are connected in such a way that a significant amount of power is wasted.

FIG. 1 shows a well known circuit for powering an optical transceiver system 10 by a voltage source 12. The transceiver system 10 includes a voltage regulator 14 and the other transceiver components simply shown as block 16. In well known fashion, the voltage regulator 14 sends a small amount of current down line 18 to bypass block 16, this allowing the voltage across block 16 to be maintained constant or essentially constant. The resistance or impedance between lines 20 and 22 is adjusted by the regulator such that the voltage drop across lines 20 and 22 of the regulator may vary to compensate for variations in source 12, thus maintaining the voltage across 16. The power used by the voltage regulator is wasted in the sense that it is simply expended to protect the useful components of block 16 from any adverse effects of supply fluctuations.

Assuming that the block 16 included a laser diode (not separately shown) and cooling of the diode is to be made using a thermoelectric cooler, FIG. 2 shows a known way of attaching the same source 12 to a second voltage regulator 24 which regulates power supplied to a thermoelectric cooler 26. The thermoelectric cooler is in thermal contact with the unshown laser which is being cooled. Again, the power used by the voltage regulator 24 is wasted in the sense that it is simply expended to stabilize the voltage across useful component thermoelectric cooler 26. Since the source 12 often is 12 volts and the thermoelectric cooler 26 should have for example about 1 volt maintained across it, the circuit of FIG. 2 wastes more energy than is put to good use.

FIG. 3 is a simplified perspective showing how the prior art includes a structure having a laser diode 28 with a monitor photodiode 30, thermoelectric cooler 32, and thermistor 34 sold as a unit within or on housing 36.

A known or prior art way of hooking up the FIG. 3 components is shown in simplified form in FIG. 4. The photodiode 30 receives a portion of the output of laser 28, which output is stabilized by feedback laser drive circuit 38 and reference adjust variable resistor 40. A temperature feedback circuit 42 uses thermistor 34 and reference adjust resistor 44 to provide feedback stabilization of the laser diode temperature. For ease of illustration, FIG. 4 doesn't show the voltage regulator and various lead and/or lag networks which would be used for improving operation.

OBJECTS AND SUMMARY OF THE INVENTION

Accordingly, it is a primary object of the present invention to provide a new and improved laser thermal control.

A more specific object of the present invention is to provide a simple, reliable laser thermal control for an optical transmitter.

A further object of the present invention is to provide laser thermal control with reduced energy waste.

Yet another object of the present invention is to provide a thermoelectric cooler circuit arrangement which is highly efficient.

A further object of the present invention is to provide laser thermal control which avoids or minimizes common prior art problems.

The above and other features of the present invention which will be more readily understood when the following detailed description is considered in conjunction with the accompanying drawings are realized by a system includes a source and a thermoelectric cooler connected to receive power from the source. A switch is in parallel with the thermoelectric cooler to form a parallel switch/thermoelectric cooler circuit, the switch operable when closed to shunt current from the source away from the thermoelectric cooler and operable when open to allow current from the source to flow through the thermoelectric cooler. The switch opens and closes dependent on temperature. (This may be temperature of the laser itself or, more preferably, an ambient temperature such as the temperature in a circuitry housing in which the laser is disposed.) A subsystem receives power from the source, the subsystem including a laser receiving power from the source and being in thermal contact with the thermoelectric cooler such that the thermoelectric cooler cools the laser when the thermoelectric cooler is turned on. The subsystem further includes a voltage regulator and wherein the thermoelectric cooler uses energy which would otherwise simply be wasted in the voltage regulator. The subsystem includes an optical transmitter using the laser to transmit. The laser is a laser diode.

In a first embodiment, the switch is a temperature sensitive switch (meaning that its closed or open state directly depends on temperature).

A second embodiment includes a temperature sensor separate from the switch and operably connected to control the switch. A comparison device compares temperature from the temperature sensor to a reference and a pulse width modulator is connected to receive an output from the comparison device and control a duty cycle of the switch dependent on the output of the comparison device.

The present invention alternately is described as a system which includes a source and a thermoelectric cooler connected to receive power from the source. A switch is in parallel with the thermoelectric cooler to form a parallel switch/thermoelectric cooler circuit, the switch operable when closed to shunt current from the source away from the thermoelectric cooler and operable when open to allow current from the source to flow through the thermoelectric cooler. A subsystem is in series with the switch/thermoelectric cooler circuit and receiving power from the source. The subsystem includes an optical transmitter having a laser receiving power from the source, the laser being in thermal contact with the thermoelectric cooler such that the thermoelectric cooler cools the laser when the thermoelectric cooler is turned on. The subsystem further includes a voltage regulator and wherein the thermoelectric cooler uses energy which would otherwise simply be wasted in the voltage regulator. The subsystem includes an optical transceiver using the laser to transmit. The laser is a laser diode. The switch is a temperature sensitive switch which opens when a temperature exceeds a given temperature. The switch is a bimetallic switch.

The present invention may alternately be described as a system which includes a source, a thermoelectric cooler connected to receive power from the source, and a subsystem in series with the thermoelectric cooler and receiving power from the source. The subsystem includes a voltage regulator and a laser receiving power from the source, the laser being in thermal contact with the thermoelectric cooler such that the thermoelectric cooler cools the laser when the thermoelectric cooler is turned on. The thermoelectric cooler uses energy which would otherwise simply be wasted in the voltage regulator. The subsystem includes an optical transmitter using the laser to transmit. The laser is a laser diode. The system further includes a switch in parallel with the thermoelectric cooler to form a parallel switch/thermoelectric cooler circuit, the switch operable when closed to shunt current from the source away from the thermoelectric cooler and operable when open to allow current from the source to flow through the thermoelectric cooler. The switch is a temperature sensitive switch which opens when a temperature exceeds a given temperature.

BRIEF DESCRIPTION OF THE DRAWINGS

The above and other features of the present invention will be more readily understood when the following detailed description is considered in conjunction with the accompanying drawings wherein like characters represent like parts throughout the several views and in which:

FIG. 1 shows a block diagram of a prior art optical transceiver arrangement as discussed above;

FIG. 2 is a block diagram of a prior art thermoelectric cooler arrangement as discussed above;

FIG. 3 is a simplified perspective of a prior art diode laser with associated components as discussed above;

FIG. 4 is a prior art circuit used for the FIG. 3 components as discussed above;

DETAILED DESCRIPTION

Figure 5:
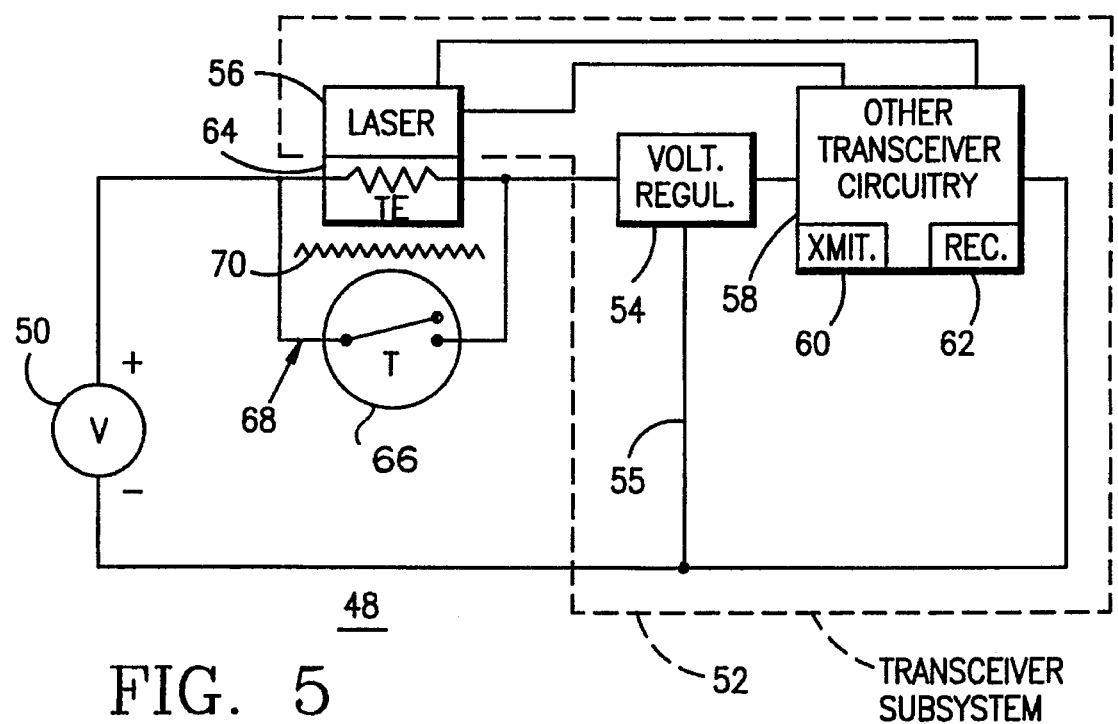
FIG. 5 is a combined schematic and block diagram of a first embodiment of the present invention.

With reference now to FIG. 5, the system 48 of the present invention includes a source 50 connected to a transceiver system 52 having voltage regulator 54, laser diode 56, and other transceiver circuitry 58. The other transceiver circuitry or subsystem 58 includes transmitter 60 and receiver 62. The details of the other transceiver circuitry 58 need not be given since these may be constructed using known techniques and since the details are not part of the present invention. It is sufficient to note that the laser diode 56 is used to generate the laser light transmitted by the transmitter 60.

Since the laser light from diode 56 is used for transmitting signals, its amplitude must be sufficient to be detected at a remote receiver (not shown). The amplitude of light output from the diode 56 will decrease when the temperature goes up. The present arrangement avoids having this amplitude decrease too much. In the preferred embodiment of FIG. 5 the transceiver send digital signals such that the amplitude need not be maintained constant. The amplitude simply must be maintained sufficiently high for detection purposes.

To prevent the amplitude of light output of laser 56 dropping below a level consistent with reliable detection, thermoelectric cooler 64 is connected in parallel to switch 66 able and to form a parallel switch/thermoelectric cooler circuit or subcircuit 68 which is in series with the transceiver subsystem 52. The thermoelectric cooler 64 is in thermal contact with laser diode 56 and preferably is mounted thereto as shown for prior art FIG. 3. Energy (or current) passes through the parallel circuit 68 to supply subsystem 52.

The switch 66 is a temperature controlled switch as indicated by the T. For example, switch 66 may be a bimetallic switch which opens when the temperature is at or above 40 degrees centigrade. When closed below that switch temperature, the current goes directly from source 50 through switch 66 to voltage regulator 54 and more generally the transceiver subsystem 52. With switch 66 closed, current is shunted around thermoelectric cooler 64 and no cooling takes place.

When the temperature is above the switching temperature (such as 40 degrees centigrade), the switch 66 opens such that current from source 50 now passes through thermoelectric cooler 64 and the laser diode 56 is cooled by the Peltier effect of the thermoelectric cooler. Advantageously, the energy used by the thermoelectric cooler 64 is energy which would otherwise be wasted in the voltage regulator 54. The use of the thermoelectric cooler 64 does not increase the power consumption of the system beyond what it would be without the thermoelectric cooler.

Without limitation, some specific numbers or values will be used in order to better explain the energy efficiency of the invention and simply for example purposes. If the voltage source 50 supplies 10 to 18 volts and the voltage regulator provides a stable 5 volts, the current through circuitry 58 will be essentially constant and may be 0.5 amps. The current on line 55 is extremely small and can be taken as zero. Therefore, the current through parallel circuit 68 is constant at 0.5 amps. With switch 66 closed, the voltage regulator 54 provides a given impedance or resistance between its right input side and left output side. When switch 66 opens, the current now goes through thermoelectric cooler 64 which may, for example, have a resistance of 1 ohm. The voltage drop across thermoelectric cooler 64 would then be 0.5 volts (0.5 amps times 1 ohm). The voltage regulator 54 then lowers its input to output impedance to provide a lower voltage drop then when the switch was closed. Energy which would otherwise be wasted in the voltage regulator 54 is thus being put to good use for cooling the laser 56. As will be readily appreciated, this energy is the power supplied over time from the source 50. This energy and the power are associated with and dependent on the current from the source, as readily understood from the definitions of power and energy.

Since the arrangement of FIG. 5 is simply designed to keep the output of laser 56 from dropping below an adequate detection level, the temperature switch 66 may be thermally remote from the thermoelectric cooler 64 as indicated by thermal barrier 70. For example, the switch 66 may simply be on an opposite side of a housing (not shown) from the thermoelectric cooler 64. In that fashion, the switch 66 responds to ambient temperature instead of cycling open and closed in response to the temperature of the laser 56 itself. This requires that the switching temperature of the switch 66 and the operation of laser 56 are such that the laser doesn't get too hot (for the required minimum output amplitude) unless the ambient temperature is above the switching temperature. Thus, the simple arrangement of FIG. 5 keeps the laser output amplitude sufficiently high without requiring complex circuitry and with very efficient use of energy. Although not shown, a monitor photodiode feedback arrangement like components 30, 38, and 40 of FIG. 4 may also be used in FIG. 5.

Figure 6:
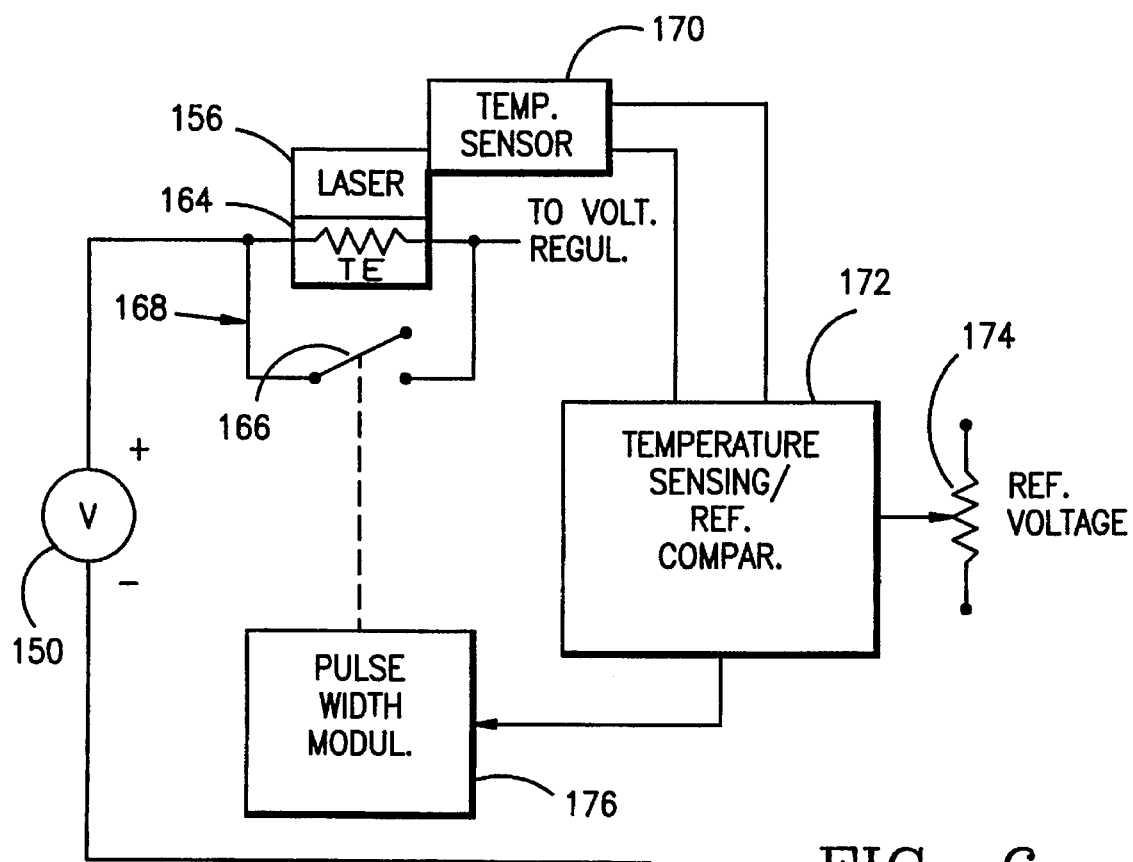
FIG. 6 is a combined schematic and block diagram of a second embodiment of the present invention.

With reference now to FIG. 6, a second embodiment is shown with components in the 100 series and having the same last two digits as the corresponding component, if any, from the FIG. 5 embodiment. Voltage source 150, laser diode 156, thermoelectric cooler 164, switch 166, and parallel switch/thermoelectric cooler circuit 168 operate respectively like components 50, 56, 64, 66, and 68 except as described below. For ease of illustration, components corresponding to 52, 54 and 58 of FIG. 5 are not shown in FIG. 6, but it will be understand that FIG. 6 would include a voltage regulator and circuitry identical to 54 and 58 of FIG. 5.

The arrangement of FIG. 6 is different then FIG. 5 in that it uses a feedback loop which closes on the laser temperature instead of the ambient temperature. A temperature sensor 170 (which may be a thermistor) is connected to temperature sensing/comparator circuit 172. Circuit 172 may operate in known fashion to compare the temperature of laser 156 with a desired temperature set by variable resistor 174. The output of comparator circuit 172 controls a pulse width modulator 176 which opens and closes switch 166 in a variable duty cycle. The switch 166 may be any of various known controlled switches such as a field effect transistor, MOSFET, etc. controllable duty. If the laser is quite hot, the modulator will keep the switch 166 open most of the time such that thermoelectric cooler 164 provides a large cooling effect. If the laser is only a little above a desired temperature, the switch 166 will be open at a reduced duty cycle such that thermoelectric cooler 164 provides less cooling effect. If the laser is below a desired temperature, the switch 166 will be closed continuously such that current is shunted around thermoelectric cooler 164 and it provides no cooling effect.

Although the FIG. 6 arrangement is more complex than FIG. 5, it may be useful when the amplitude of the laser requires accurate control. As in the FIG. 5 arrangement, it provides great energy efficiency by powering the thermoelectric cooler 164 off energy which would otherwise be wasted in the voltage regulator.

Although not shown, FIG. 5 and/or FIG. 6 could include lead and/or lag networks to promote stability and avoid feedback oscillations. Normally, this would not be needed for FIG. 5 due to the thermal isolation of the switch 66 and laser 56. However, FIG. 5 could use the feedback to control on the actual laser temperature as done with FIG. 6 (i.e., have switch 66 in thermal contact with laser 56).

As a variation of the systems of FIGS. 5 and 6, a resistor (not shown) could be used respectively to shunt some current around the respective thermoelectric coolers 64 and 164 when the respective switches 66 and 166 are closed. Specifically, if the circuitry 58 and laser 56 in the FIG. 5 embodiment (or the similar unshown components in the FIG. 6 embodiment) collectively draw more current than one would want passing through the cooler in the system, a resistor attached in parallel across the two terminals of the cooler would allow any such excess current to pass through such a shunt resistor. Although that would decrease the efficiency of the system, it would avoid having the cooler cool at too high a rate and/or avoid damaging the cooler by passage of too high a current therethrough.

Figure 7:
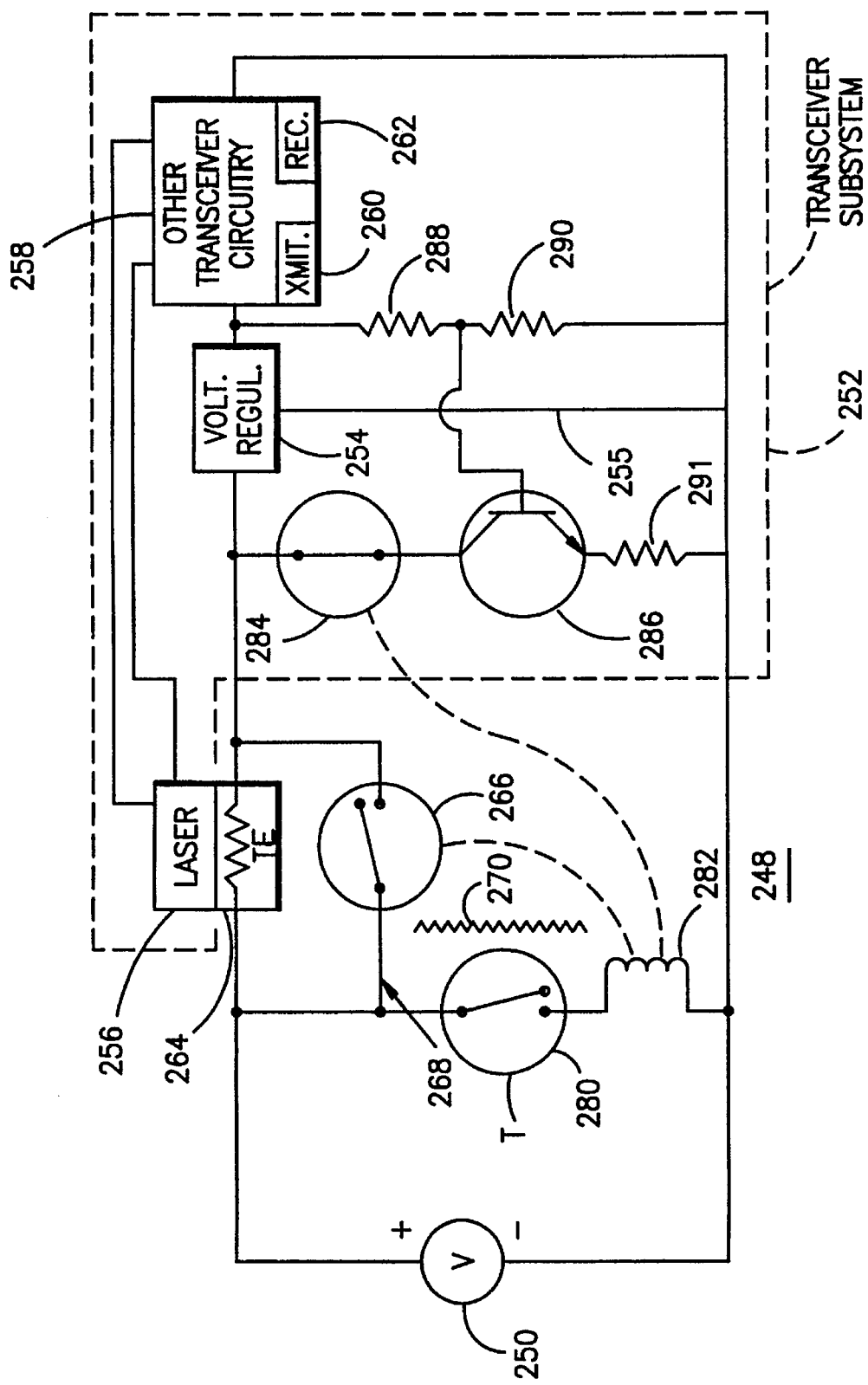
FIG. 7 is a combined schematic and block diagram of a third embodiment of the present invention.

As a variation of the systems of FIGS. 5 and 6, a third embodiment shown in FIG. 7 could be used if the circuitry 58 and laser 56 in the FIG. 5 embodiment (or the similar unshown components in the FIG. 6 embodiment) collectively draw too little current than one would want passing through the cooler in the system. The system 248 has components labeled in the 200 series with the same last two digits as the corresponding component, if any, from the FIG. 5 embodiment. Thus, components 250, 252, 254, 255, 256, 258, 260, 262, 264, 266, 268, and 270 work the same as the corresponding FIG. 5 component except as discussed hereafter.

The parallel switch/thermoelectric cooler circuit 268 functions essentially the same as parallel circuit 68 of FIG. 5 except that switch 266 is indirectly temperature controlled as discussed below (instead of directly temperature controlled as is switch 66 of FIG. 5). Switch 266 is a normally open pair of contacts controlled by relay coil 280 in series with a normally closed temperature controlled switch 282 (i.e., thermistor or other switch as discussed for 66 and 166 above) thermally isolated from cooler 264 by thermal barrier 270. When the temperature exceeds a given amount, temperature switch 280 opens and current is cut off from relay coil 280, which in turn opens switch 266 such that cooling is started. Additionally, to avoid limiting the current in the cooler 264 to below a desired amount of current, relay coil 280 controls a normally closed switch 284 in series with transistor 286. The transistor 286 receives a constant voltage from the voltage divider resistors 288 and 290. Transistor 286 is stabilized over temperature by resistor 291. When switch 280 opens and in turn cuts off current to relay coil 282, switch 284 is closed and shunts a constant current through transistor 286. Thus, some of the current passing through the cooler 264 may be shunted around the other circuitry if the cooler uses more current than would otherwise be used by laser 256 and circuitry 258.

Although specific constructions have been presented herein, it is to be understood that these are for illustrative purposes only. Various modifications and adaptations will be apparent to those of skill in the art. In view of possible modifications, it will be appreciated that the scope of the present invention should be determined by reference to the claims appended hereto.

What is claimed is:

1. A system comprising:
   a source of electricity operable to provide current and associated power and associated energy;
   a thermoelectric cooler connected by electrical lines to receive power from said source;
   a switch in parallel with said thermoelectric cooler to form a parallel switch/thermoelectric cooler subcircuit, said switch operable when closed to shunt current supplied from said source away from said thermoelectric cooler and operable when open to allow current supplied from said source to flow through said thermoelectric cooler, said switch opening and closing dependent on temperature; and
   a subsystem receiving power from said source by electrical connections thereto, and wherein said subsystem includes a laser receiving power from said source and being in thermal contact with said thermoelectric cooler such that said thermoelectric cooler such said laser when said thermoelectric cooler is turned on.

2. The system of claim 1 wherein said subsystem further includes a voltage regulator and wherein said thermoelectric cooler uses energy from the source to provide cooling, which energy would otherwise simply be wasted in said voltage regulator and wherein said subsystem is in series with said switch/thermoelectric cooler subcircuit.

3. The system of claim 2 wherein said subsystem includes an optical transmitter using said laser to transmit optical signals.

4. The system of claim 3 wherein said laser is a laser diode.

5. The system of claim 4 wherein said switch is a temperature controlled switch.

6. The system of claim 4 further comprising a temperature sensor separate from said switch and operably connected to control said switch.

7. The system of claim 6 further comprising a comparison device to compare temperature from said temperature sensor to a reference and a pulse width modulator connected to receive an output from said comparison device and control a duty cycle of said switch dependent on said output of said comparison device.

8. The system of claim 1 wherein said laser is a laser diode.

9. The system of claim 1 wherein said switch is a temperature sensitive switch.

10. A system comprising:
    a source of electricity operable to provide a current and associated power and associated energy;
    a thermoelectric cooler connected by electrical lines to receive power from said source;
    a switch in parallel with said thermoelectric cooler to form a parallel switch/thermoelectric cooler subcircuit, said switch operable when closed to shunt current provided from said source away from said thermoelectric cooler and operable when open to allow current provided from said source to flow through said thermoelectric cooler; and
    a subsystem in series with said switch/thermoelectric cooler subcircuit and receiving power from said source by electrical connections thereto, and wherein said subsystem includes an optical transmitter having a laser receiving power from said source, said laser being in thermal contact with said thermoelectric cooler such that said thermoelectric cooler cools said laser when said thermoelectric cooler is turned on.

11. The system of claim 10 wherein said subsystem further includes a voltage regulator and wherein said thermoelectric cooler uses energy from the source to provide cooling, which energy would otherwise simply be wasted in said voltage regulator.

12. The system of claim 11 wherein said subsystem includes an optical transceiver using said laser to transmit.

13. The system of claim 10 wherein said laser is a laser diode.

14. The system of claim 10 wherein said switch is a temperature sensitive switch which opens when a temperature exceeds a given temperature.

15. The system of claim 14 wherein said switch is a bimetallic switch.

16. A system comprising:
    a source of electricity operable to provide a current and associated power and associated energy;
    a thermoelectric cooler connected by electrical lines to receive power from said source; and
    a subsystem in series with said thermoelectric cooler and receiving power from said source by electrical connections thereto, and wherein said subsystem includes a voltage regulator and a laser receiving power from said source, said laser being in thermal contact with said thermoelectric cooler such that said thermoelectric cooler cools said laser when said thermoelectric cooler is turned on, and wherein said thermoelectric cooler uses energy from the source to provide cooling, which energy would otherwise simply be wasted in said voltage regulator.

17. The system of claim 16 wherein said subsystem includes an optical transmitter using said laser to transmit.

18. The system of claim 16 wherein said laser is a laser diode.

19. The system of claim 16 further comprising a switch in parallel with said thermoelectric cooler to form a parallel switch/thermoelectric cooler subcircuit, said switch operable when closed to shunt current provided from said source away from said thermoelectric cooler and operable when open to allow current provided from said source to flow through said thermoelectric cooler.

20. The system of claim 19 wherein said switch is a temperature sensitive switch which opens when a temperature exceeds a given temperature.

* * * * *

UNITED STATES PATENT AND TRADEMARK OFFICE
CERTIFICATE OF CORRECTION

PATENT NO. : 5,602,860
DATED : February 11, 1997
INVENTOR(S) : MASONSON

It is certified that error appears in the above-indentified patent and that said Letters Patent is hereby corrected as shown below:

Claim 1, line 18, (column 7, line 35), change "such" (second occurrence) to -- cools --.

Signed and Sealed this

Twenty-fourth Day of June, 1997

Attest:

BRUCE LEHMAN

*Attesting Officer*     *Commissioner of Patents and Trademarks*